COMMUNICATION SYSTEM
Original Filed Feb. 9, 1946 3 Sheets-Sheet 1
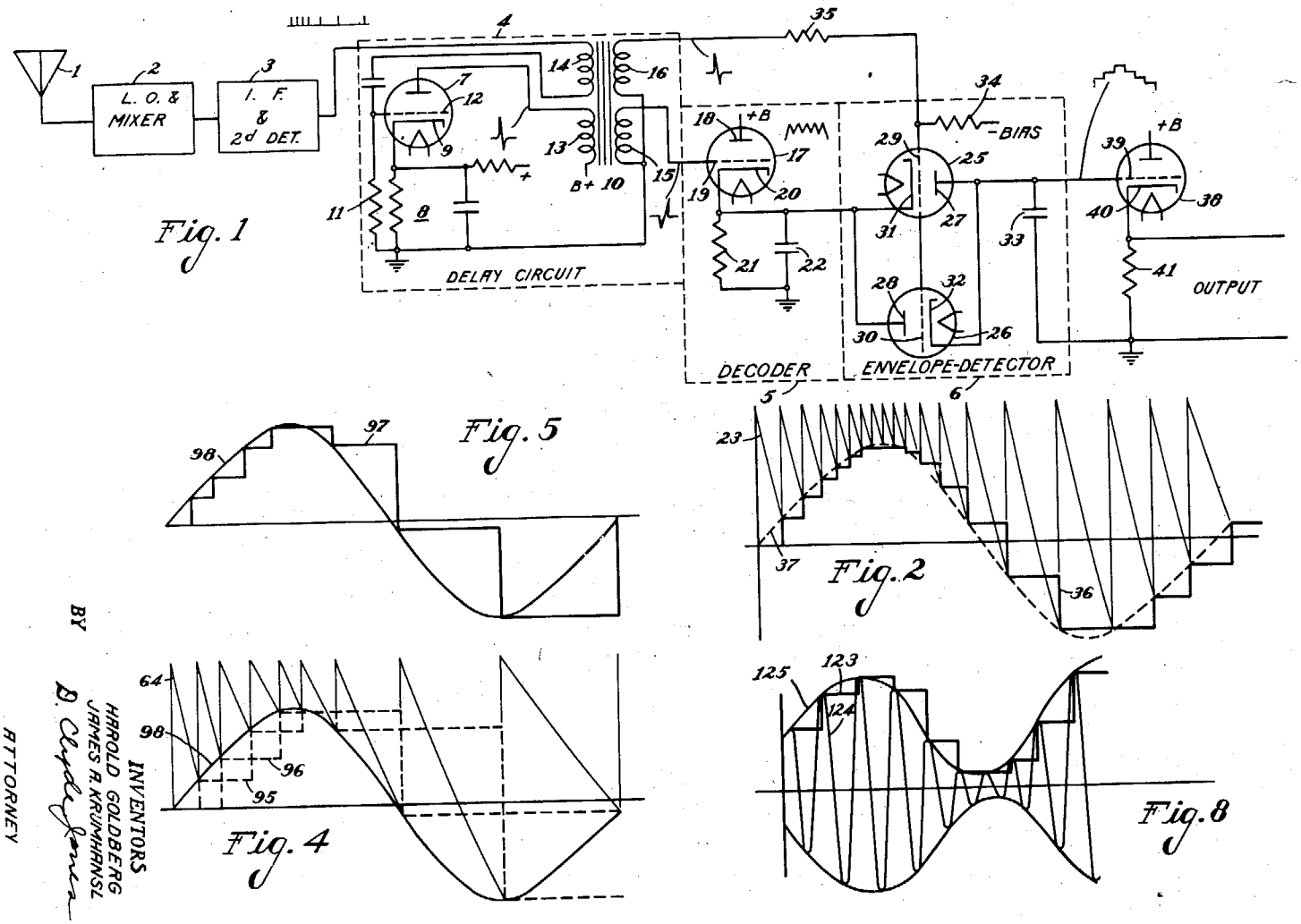
INVENTORS
HAROLD GOLDBERG
JAMES A. KRUMHANSL
BY D. Clyde Jones
ATTORNEY

COMMUNICATION SYSTEM

Original Filed Feb. 9, 1945 3 Sheets-Sheet 2

INVENTORS
HAROLD GOLDBERG
JAMES A. KRUMHANSL
BY D. Clyde Jones
ATTORNEY

Oct. 24, 1950 J. A. KRUMHANSL ET AL Re. 23,288

COMMUNICATION SYSTEM

Original Filed Feb. 9, 1945 3 Sheets-Sheet 3

INVENTORS
HAROLD GOLDBERG
JAMES A KRUMHANSL

BY D. Clyde Jones

ATTORNEY

Reissued Oct. 24, 1950

Re. 23,288

UNITED STATES PATENT OFFICE 23,288

COMMUNICATION SYSTEM

James A. Krumhansl, Ithaca, N. Y., and Harold Goldberg, Washington, D. C., assignors to Stromberg-Carlson Company, a corporation of New York.

Original No. 2,467,486, dated April 19, 1949, Serial No. 646,616, February 9, 1946. Application for reissue April 6, 1950, Serial No. 154,416

14 Claims. (Cl. 250—6)

Matter enclosed in heavy brackets [ ] appears in the original patent but forms no part of this reissue specification; matter printed in italics indicates the additions made by reissue

This invention relates to communication systems and more particularly to detecting means for such systems.

It has been proposed to transmit intelligence in the form of a train of pulses spaced apart or coded according to a function of time as well as a function of the amplitude of a modulating voltage representing the intelligence to be transmitted. One object of this invention is to provide in such a system an improved method of and means for translating or recreating a close facsimile of the original intelligence.

While our invention is particularly useful in pulse communication systems it is not limited thereto and the principles of the detecting system described hereinafter are also applicable to other forms of communication including amplitude modulation radio transmission systems. It is, therefore, another object of our invention to provide new and improved detecting means for communication systems generally.

The foregoing objects are achieved by providing a receiving system including an envelope detector. This detector may comprise two electron discharge devices, each including an anode, a cathode, and a control electrode or grid. The discharge devices are inversely connected, i. e., the anode of one is connected to the cathode of the other and the cathode of the one is connected to the anode of the other. A capacitor is connected between each of these anode-cathode connections and ground. A voltage representing a desired characteristic of the received signal is applied across one of the capacitors. One or the other of the discharge devices is rendered conductive at predetermined times which causes the instantaneous charge on the capacitor receiving the signal to be transferred to the other capacitor. The voltage appearing across the other capacitor is applied to a suitable audio system for reproduction.

Figure 6:
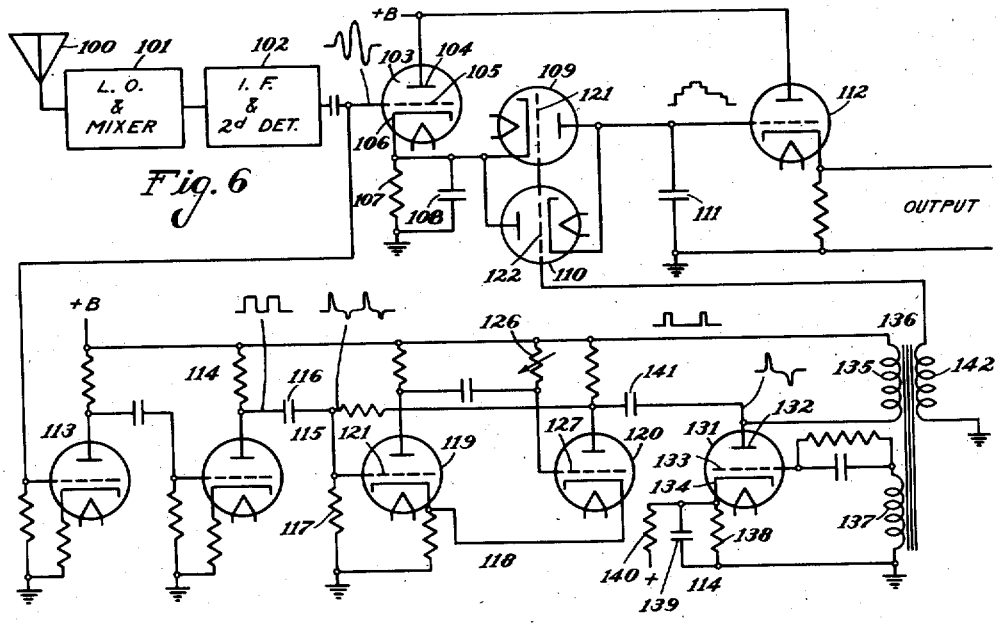
Figure 7:
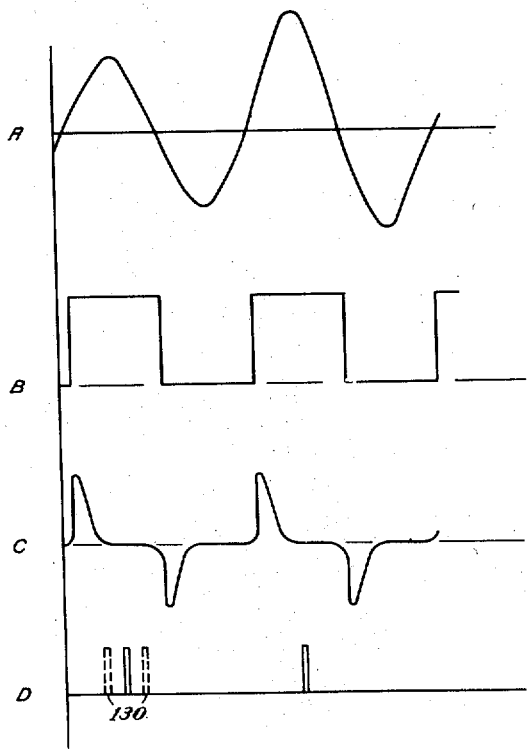
Figure 3:
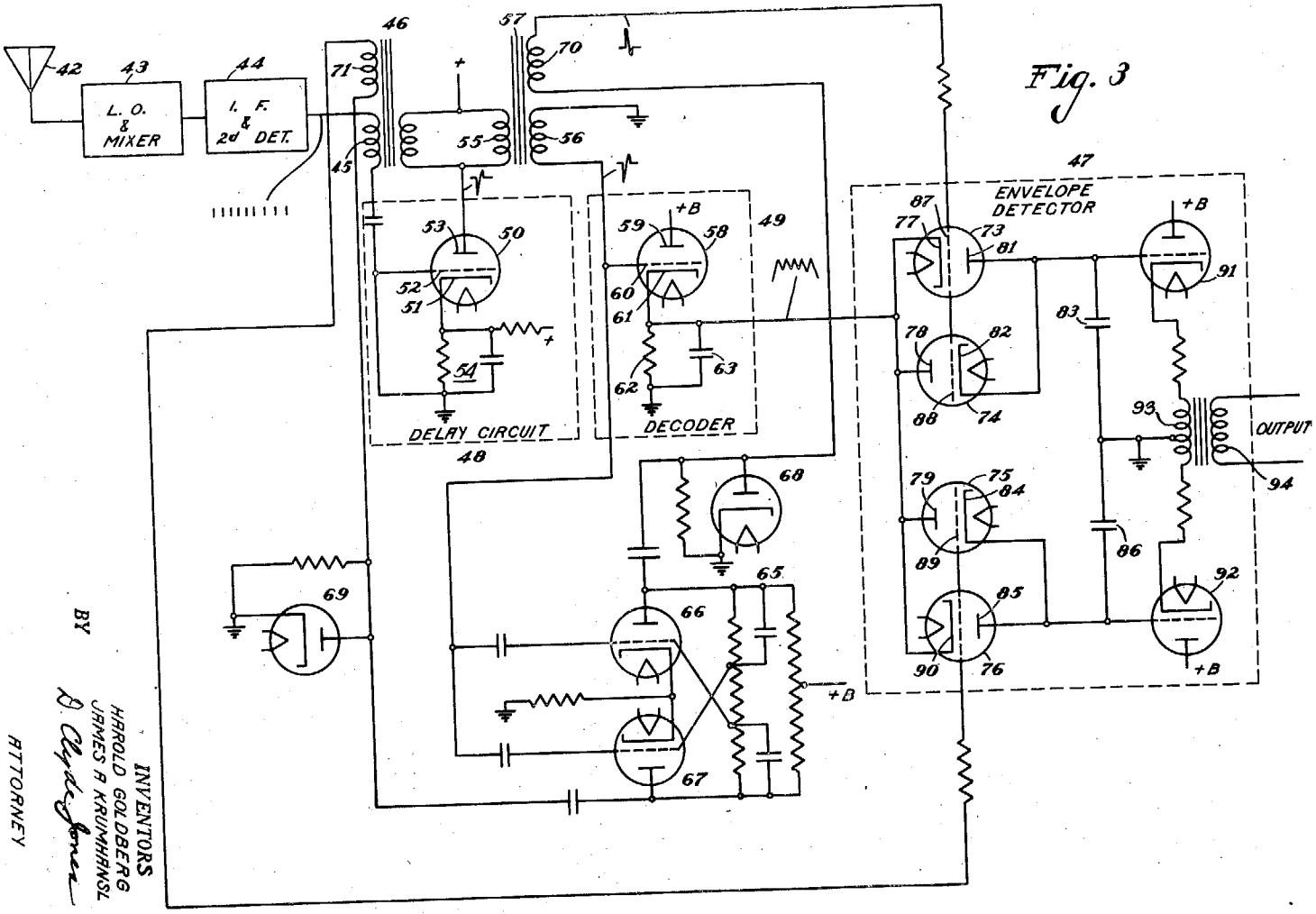

Further objects and advantages will become apparent as the following description proceeds. For a better understanding of our invention, reference is made to the following description and to the accompanying drawings in which:

Fig. 1 is a schematic diagram illustrating the application of our invention to a pulse communication system, Fig. 2 is a chart useful in explaining the operation of the system shown in Fig. 1, Fig. 3 is a second application of our invention to a pulse communication system embodying push-pull principles, Figs. 4 and 5 are charts illustrating the operation of the circuit shown in Fig. 3, Fig. 6 is a schematic diagram illustrating the application of our invention to an amplitude-modulated system, and Figs. 7 and 8 are charts illustrating the operation of the circuit shown in Fig. 6.

Referring to Fig. 1, there is illustrated a receiving system adapted to receive space or position-modulated pulses such as would be transmitted in the system shown, described and claimed in the co-pending applications of Harold Goldberg, Serial No. 646,614, *now abandoned*, filed February 9, 1946, and Serial No. 646,615, filed February 9, 1946, *now Patent No. 2,466,230, issued April 5, 1949*, and assigned to the same assignee as the present invention. The receiving system of our invention includes a suitable antenna 1, a combined local oscillator and mixer unit represented by block 2, and an I. F. amplifier and second detector indicated by the block 3. If desired, the signals may then be limited or clipped so that all signals at this stage of reproduction are positive pulses of constant amplitude. Means for accomplishing this purpose is not shown but is well known in the art.

There is provided means indicated by numeral 4 for deriving a delayed pulse from each received pulse for causing operation of a decoder 5 which in turn provides voltage for causing operation of the envelope detector 6 at predetermined times.

The delay circuit 4 utilizes a blocking oscillator and makes use of the fact that the output of a blocking oscillator may not be unidirectional, but may have considerable overshoot, i. e., during a part of a complete oscillation, the voltage reverses. The overshoot, of course, is delayed with respect to the main peak of the pulse by a definite time interval.

In order to amplify and sharpen the received pulses, there is provided the blocking oscillator illustrated in Fig. 1 comprising an electron discharge device 7, transformer 10 and R-C network 8 (of R-C product much greater than the time spacing between received pulses) including a resistance and a capacitance connected in shunt relationship between the cathode 9 of the discharge device 7 and ground. The upper end of the R-C network is connected to a suitable source of bias potential of such value as normally to prevent operation of the oscillator in the absence of received pulses. Positive pulses from the second detector, or clipper stage, if used, are supplied to the control electrode 12 of device 7 through winding 14 of the transformer 10 and trigger the oscillator or generator circuit to cause a voltage to appear across the R-C network. Since the received pulses are differently spaced, a train of pulses will be produced having equal maximum amplitudes spaced similarly to the received pulses.

The transformer 10 is provided with two additional windings 15 and 16. The connections to these windings are made in such a manner that output voltages are reversed in sense, the sense of the voltage appearing across winding 15 being reversed or inverted with respect to that across the winding 13 and that appearing across winding 16. The output from winding 15 is applied to the decoder 5 which comprises a sawtooth wave generator including an electron discharge device 17 which may be a triode having an anode 18 connected to a suitable source of positive potential, a control electrode 19 connected to one terminal of winding 15 of transformer 10, and a cathode 20. An R-C network comprising resistor 21 and electric storage means such as condenser 22 connected in parallel therewith is inserted between cathode 20 and ground. The R-C constant must be equal to the R-C constant of the coder in the transmitter as explained in the above-identified co-pending applications. The other terminal of transformer winding 15 is grounded. Inasmuch as inverted pulses are applied to grid 19, the overshoot portions of the pulses developed in the delay circuit trigger the discharge device 17 to charge condenser 22 to a maximum amplitude. Between operations of device 17, the voltage across condenser 22 decreases to minima which lie on a curve (represented by the dashed line 37 in Fig. 2) representing the original intelligence. As is fully explained in the above-mentioned copending applications, the decoder is caused to re-charge the condenser each time the voltage across the R-C network decays to the point represented by the junction of the dashed line 37 and the voltage line 23 (Fig. 2).

In order to separate the envelope from the sawtooth wave i. e. to detect the minima of the pulses in the decoder output, the demodulator or envelope detector 6 is provided. The envelope detector in this form of our invention comprises two electron discharge devices 25 and 26 which may be of the triode type including anodes 27 and 28 respectively, control electrodes 29 and 30 respectively, and cathodes 31 and 32 respectively. Anode 27 is connected to cathode 32, cathode 31 is connected to anode 28, and the control electrodes are connected together. The output of the decoder is impressed on the connection between anode 28 and cathode 31. Uninverted or undelayed pulses substantially corresponding in time to the original pulses are applied to the control electrodes 29 and 30 by means of a connection between the control electrodes and one terminal of the winding 16 of transformer 10, the other terminal of the winding 16 being grounded. Electric storage means such as a capacitor 33 is connected between ground and the connection joining anode 27 to cathode 32.

The recurring voltage generated in the decoder and appearing across the capacitor 22 is impressed on the anode 28 and cathode 31.

As briefly described above the voltage across capacitor 22 decays exponentially until the oscillator or generator is again triggered and the next charging voltage is generated. The spacing between the charging periods is dependent upon the amplitude of the original signal. Thus, as the amplitude of the signal voltage increases the generator triggers more rapidly and the decay portion of the cycle is halted earlier and vice versa. Obviously, the overshoot of the pulses utilized to trigger the decoder takes place at a definite time interval preceding the next succeeding pulse. Therefore, by operating the decoder by means of the delayed or overshoot pulse the envelope detector is rendered operative prior to the receipt of the undelayed pulse by a time equal to the above-mentioned interval. The capacitor 33 is at that time connected across the capacitor 22 through the conducting path of one of the discharge devices so that capacitor 33 is charged to the same voltage as that across capacitor 22 at that instant. The capacitance of capacitor 33 is made substantially less than that of capacitor 22 so that the voltage of capacitor 22 is substantially unaffected by the transfer of charge from capacitor 22 to capacitor 23.

A double set of discharge devices or tube elements is necessary, whether in a single envelope or in the form of a pair of tubes 25 and 26 as shown, because the voltage across capacitor 33 at any given time may be greater or less than that across capacitor 22 depending upon the direction of change of the voltage across capacitor 22. If the voltage across capacitor 33 is greater than that across capacitor 22, electron discharge device 25 is rendered conductive whereas, if the voltage across capacitor 33 is less than that of capacitor 22, electron discharge device 26 is rendered conductive. The discharge devices are so biased that when the pulse subsides conduction through discharge device 25 or discharge device 26 is cut off. In the embodiment of our invention illustrated in Fig. 1 the necessary negative bias is supplied through a resistor 34 connected between the control electrodes and a suitable source of negative potential. However, the potential at the upper end of resistor 21 and condenser 22 is never negative so that in effect the control electrodes 29 and 30 derive a negative bias from the R-C network of the decoder 5. The resistance 34 may be used whenever the bias obtained from the decoder is insufficient.

In order to prevent transients, there may be provided a resistor 35 in the connection between the transformer winding 16 and the control electrodes 29 and 30.

In order to prevent substantial decrease in charge across condenser 33 during the intervals between samplings of the voltage across condenser 22 or, in other words, when neither of the discharge devices 25 and 26 is conducting, the output from the condenser 33 is connected to the audio system (not shown) through a high impedance device whereby discharge between pulses is prevented. In Fig. 1, the high impedance device takes the form of a cathode follower, including an electron discharge device 38 which may be a triode. The upper end of condenser 33 is connected to the control electrode 39 of the discharge device 38. The cathode 40 of the discharge device is connected to ground through a suitable resistor 41. Since the input impedance of the cathode follower is very high because of the absence of grid leak, there will be no appreciable discharge from capacitor 33 between pulses.

Referring to Fig. 2, the full line 36 represents the voltage appearing across capacitor 33 and, of course, is also representative of the voltage appearing across resistance 41. This voltage may be filtered and fed to a suitable audio system for reproduction into sound.

In Fig. 3 there is illustrated a modification of our invention utilizing push-pull detection for use with a push-pull pulse transmission system such as that disclosed in co-pending application Serial No. 646,615 referred to above. The transmitted signals are intercepted on a suitable antenna 42 connected to a suitable local oscillator and mixer stage 43 provided to translate the signal into a suitable intermediate frequency. The intermediate frequency signals are amplified and detected in the intermediate frequency amplifier and second detector represented by the block 44. The positive pulses derived from the second detector are supplied through the winding 45 of the transformer 46 to the envelope detector 47 which serves as a push-pull demodulator and functions to detect the envelopes of the alternate minima, and to combine the resulting push-pull output through the agency of a delay circuit 48 and decoder 49.

Delay circuit 48 comprises a triggered blocking oscillator including an electron discharge device 50, illustrated as of the triode type having a cathode 51, a control electrode 52 and an anode 53. The blocking oscillator not only serves as a source of pulses for a timing wave but also as a pulse amplifier, sharpener, and clipper. The R-C network 54 connected in the cathode lead provides a bias voltage for the control electrode or grid 52 which normally keeps the oscillator circuit from oscillating. A positive pulse from the second detector triggers the oscillator circuit and causes it to generate a single blocking oscillator pulse. The oscillator pulses are of constant amplitude and because of their form it is possible also to obtain a delayed pulse as described above by reversing the sense of the output pulse from the transformer and utilizing the overshoot as a trigger pulse, the delayed pulse or overshoot thus providing a means for obtaining a delayed pulse without the use of delay networks. The delayed pulse appearing on the anode 53 of the electron discharge device 50 is transferred to the decoder 49 by means of primary winding 55 and secondary winding 56 of transformer 57. The decoder 49 comprises a saw tooth generator including an electron discharge device 58 having an anode 59 connected to a suitable source of positive potential, a control electrode 60 connected to the secondary winding 56 of transformer 57, and a cathode 61 connected to ground through an R-C network consisting of resistance 62 and capacitor 63 connected in shunt relationship. The delayed pulse is thus applied to control electrode 60 to cause the generation of a voltage each time a pulse is received. A positive pulse applied to the control electrode of the decoder causes the condenser 63 to charge to a fixed value. The subsidence of the positive pulse results in the cut-off of the discharge device 58 so that the condenser 63 discharges exponentially through resistor 62 as indicated graphically in Fig. 4 wherein numeral 64 represents the recurring voltage peaks.

There is provided a scale-of-two counter 65 comprising triodes 66 and 67 which function after the manner of an Eccles-Jordan circuit to produce two rectangular wave outputs which are capacitively coupled to diodes 68 and 69 respectively. The diodes act as direct current restorers. The output of restorer 68 is added to the pulse in secondary winding 70 of transformer 57 and the output of diode 69 is added to the received pulse in secondary winding 71 of transformer 46.

The push-pull envelope detector 47 may comprise four electron discharge devices 73, 74, 75, and 76. Cathode 77 and anode 78 of discharge devices 73 and 74, respectively, and anode 79 and cathode 80 of discharge devices 75 and 76, respectively, are connected together and to the upper end of capacitor 63 of decoder 49. Anode 81 and cathode 82 of electron discharge devices 73 and 74, respectively, are connected to the upper side of capacitor 83 as viewed in Fig. 3. Cathode 84 and anode 85 of discharge devices 75 and 76 respectively, are connected to the lower side of a capacitor 86. The lower side of capacitor 83 and the upper side of condenser 86 are connected together and to ground. The combined voltages appearing in transformer winding 70 are applied to the control electrodes 87 and 88 of electron discharge devices 73 and 74, respectively, and the combined voltage appearing across winding 71 is applied to control electrodes 89 and 90 of discharge devices 75 and 76, respectively. In this manner the two envelope detectors will be activated alternately and each by itself determines the alternate minima of the decoder, and the outputs of the two detectors are, therefore, push-pull variations of the original modulation.

The two detectors are respectively coupled by the condensers 83 and 86 to cathode followers including the electron discharge devices 91 and 92. The transformer winding 93 in the cathode circuits of the followers combine the push-pull outputs through a secondary winding 94 to a suitable output circuit for reproduction.

Fig. 4 depicts the action taking place in the circuit of Fig. 3. As stated above the voltage appearing across the condenser 63 is represented by the numeral 64 in Fig. 4. The dashed line 95 represents the charge on one of the condensers as, for example, condenser 83 and the dashed line 96 represents the voltage on the other condenser 86. The resultant or combined voltage is shown by the stepped line 97 of Fig. 5. In each of Figs. 4 and 5 the envelope of the minima which is the signal to be reproduced is represented by the numeral 98.

Our invention is not limited to pulse systems. For example, it is also applicable to amplitude modulation, particularly in cases where the envelope frequency is not much lower than the carrier frequency. Fig. 6 illustrates an application of the principles of our invention to amplitude modulation. There is shown a suitable antenna 100 for receiving the signals transmitted from a suitable amplitude modulation transmitter. A suitable local oscillator and mixer stage is indicated by the numeral 101 and the numeral 102 is used to indicate the insertion of a suitable I. F. amplifier and second detector. The output of the second detector is fed to a cathode follower circuit including an electron discharge device 103 including an anode 104 connected to a suitable source of positive potential, a control electrode 105 connected to the output of the second detector and a cathode 106 connected to ground through a resistor 107. A capacitor 108 is connected in shunt with the resistor 107. The time constant of capacitor 108 and resistor 107 should be short so that the condenser discharges before it is re-charged by operation of discharge device 103. The voltage appearing across the capacitor 108 is applied to one of the inversely connected electron discharge devices 109 and 110 respectively in similar manner to that illustrated in Fig. 1. Condenser 111 is connected between ground and the other anode-cathode connection as well as to a cathode follower output device 112. It will be noted that the voltage representing the signal rather than the delayed voltage is applied to the first mentioned anode-cathode connection. In the system shown in Fig. 6 it is not desired to compare the voltage changes prior to the reenergization of the discharge device 103 as was the case in the pulse receiving system, but it is desired to sample the voltage across capacitor 108 at the peaks of the modulated carrier waves. In order to render conductive one or the other of the discharge devices 109 and 110 the output of the second detector is fed through means 113 for clipping the signal, means 114 for squaring the clipped signals and differentiating means 115 comprising a capacitor 116 and a resistance 117 to provide trigger pulses for a delay multi-vibrator 118. The operation of the system shown in Fig. 6 is illustrated in Fig. 7 wherein at A there are illustrated a few cycles of the modulated carrier, at B the squared waves appearing in the output of means 114, and at C the peaked pulses derived from the differentiating means 115 which are applied as trigger pulses to the multi-vibrator 118. The multi-vibrator comprises discharge devices 119 and 120, the circuit connections being such that device 119 is normally non-conductive and device 120 normally conductive. The trigger pulses applied to the control electrode 121 of electron discharge device 119 render that device conductive and discharge device 120 non-conductive to establish positive pulses at the anode of device 120. These pulses are impressed on a blocking oscillator comprising an electron discharge device 131 which may be a triode having an anode 132, control electrode 133 and cathode 134. An R-C network of suitable R-C product is connected between the cathode and ground and comprises resistance 138 and capacitor 139. The pulses are impressed on anode 132 through a suitable coupling capacitor 141 and also to one end of winding 135 of transformer 136, the other end of winding 135 being connected to a suitable source of positive potential. Winding 137 of transformer 136 is connected from ground to control electrode 133 through a suitable grid leak-grid condenser combination. The cathode 134 is also connected through resistance 140 to a suitable source of positive potential, thereby establishing bias for discharge device 131. Capacitor 141 and winding 135 serve to differentiate the pulses, the negative going peak of the differentiated pulses appearing as positive voltage pulses in winding 137, causing conduction in device 131. The dip in anode voltage is transformed into a positive pulse in winding 142 of transformer 136.

These pulses are applied to the control electrode 121 and 122 of the electron discharge devices 109 and 110 respectively of the envelope detector. Whenever either of the discharge devices 109 and 110 becomes conductive, capacitor 111 assumes the voltage appearing across 108 capacitor at that instant. As seen in Fig. 8, if the envelope detector operates at the peaks of the carrier current wave, the voltage across capacitor 111 is stepped as indicated by the numeral 123 in Fig. 8. In Fig. 8 the carrier voltage is represented by the numeral 124 and the envelope by the numeral 125.

To enable adjustment of the circuit to cause sampling and equalization of capacitor voltages at the carrier peaks there is provided means for adjusting the bias on the control electrode of the electron discharge device 120 in the form of a suitable potentiometer or resistance 126 connected between the control electrode 127 of discharge device 120 and a suitable source of positive potential. The setting of control 126 is not particularly critical inasmuch as the relatively gradual change in voltage over a relatively long period of time at the peak of the carrier wave will give substantially the same results as can be seen by reference to Fig. 7, D. While conditions are exaggerated for purposes of illustration, it will be seen that if the pulses derived from the multi-vibrator occur at any time between the dotted positions indicated by the numeral 130 the voltage across capacitor 111 will be different only to a minor degree from that which would result if the envelope detector operated at exactly the maximum of the carrier wave.

The circuit of Fig. 6 may be simplified by omitting the last mentioned blocking oscillator 131 and transformer 136. Instead, the negative pulses appearing at the anode of discharge device 119 can be differentiated and the positive going part of the differentiated pulse employed to trigger the envelope detector.

While we have shown and described particular embodiments of our invention it will be obvious to those skilled in the art that changes and modifications may be made without departing from our invention in its broader aspects and we, therefore, aim in the appended claims to cover all such changes and modifications as fall within the true spirit and scope of our invention.

What we claim as new and desire to secure by Letters Patent of the United States is:

1. In a communication system having transmitting means and receiving means, the receiving means including means for detecting intelligence to be reproduced including a pair of electron-discharge devices, each of said devices having an anode, a cathode, and a control electrode, means for inversely connecting said anodes and cathodes and means for connecting said control electrodes, one of said anode-cathode connections constituting a first input terminal and said control electrode connection constituting a second input terminal to said detecting means, a first electric storage means connected between said first input terminal and ground, a second electric storage means connected between the other anode-cathode connection and ground, means for impressing a voltage representing the received signal on said first input terminal, and means actuated by the received signal and coupled to said second input terminal to render conductive one or the other of said electron discharge devices depending upon the relative potentials at the anode-cathode connections at predetermined times with respect to the received signal whereby the potential of said first electric storage means is transferred to said second electric storage means during such conductive periods.

2. In a communication system having transmitting and receiving means, said receiving means including means for detecting the intelligence to be reproduced including a pair of electron-discharge devices, each of which devices has an anode, a cathode, and a control electrode, said anodes and cathodes being inversely connected and said control electrodes being connected together, one of said anode-cathode connections constituting a first input terminal of said detecting means and said control electrode connection constituting a second input terminal, a third electron discharge device having an anode, a cathode and a control electrode, a resistance connected between the cathode of said third discharge device and ground, a first capacitance connected in shunt with said resistance, a second capacitance connected between the other anode-cathode connection and ground, means for impressing a voltage representing the received signal on the control electrode of said third device whereby the charge on said first capacitance corresponds to a characteristic of the received signals, the ungrounded end of said first capacitance being also connected to said first input terminal whereby the potential of said first capacitance is transferred to said second capacitance whenever either of said pair of electron discharge devices is rendered conductive, and means for rendering one or the other of said pair of electron discharge devices conductive at desired times.

3. In a communication system having transmitting and receiving means, said receiving means including means for detecting the intelligence to be reproduced including a pair of electron-discharge devices, each of which devices has an anode, cathode, and a control electrode, said anodes and cathodes, being inversely connected and said control electrodes being connected together, one of said anode-cathode connections constituting a first input terminal of said detecting means and said control electrode connection constituting a second input terminal, a third electron discharge device having an anode, a cathode and a control electrode, a resistance connected between said cathode of said third discharge device and ground, a first capacitance connected in shunt with said resistance, a second capacitance connected between the other anode-cathode connection and ground, means for impressing a voltage representing the received signal on the control electrode of said third device whereby the charge on said first capacitance corresponds to a characteristic of the received signals, the ungrounded end of said first capacitance being also connected to said first input terminal whereby the potential of said first capacitance is transferred to said second capacitance whenever either of said pair of electron discharge devices is rendered conductive, means for rendering one or the other of said pair of electron discharge devices conductive at desired times, and high impedance output means coupled to said second capacitance.

4. In a communication system having means for transmitting and receiving signals, said receiving means comprising means for detecting intelligence to be reproduced including a pair of electron-discharge devices, each of which devices has an anode, a cathode, and a control electrode, said anodes and cathodes being inversely connected and said control electrodes being connected together, one of said anode-cathode connections constituting a first input terminal to said detecting means and said control electrode connection constituting a second input terminal, a first capacitance connected between said first input terminal and ground, a second capacitance connected between the other anode-cathode connection and ground, means for impressing a voltage representing the received signal on said first input terminal, and means actuated by the received signal and coupled to said second input terminal to render conductive one or the other of said electron discharge devices depending upon relative potentials at the anode-cathode connection at predetermined times with respect to the received signal, whereby the potential of said first capacitance is transferred to said second capacitance during such conductive periods, the capacity of said second capacitance being substantially less than that of said first capacitance so that the potential on said first capacitance is not substantially affected by the transfer of potential from said first to said second capacitance.

5. In a communication system including means for transmitting and receiving pulses representing intelligence to be communicated, said receiving means including a pair of electron discharge devices, each discharge device having an anode, a cathode and a control electrode, said anodes and cathodes being inversely connected, means for impressing the received pulses on said control electrodes, electric storage means connected between each anode-cathode connection and ground, means for reproducing each received pulse after a predetermined time delay, means for charging one of said storage means in accordance with the voltage of said delayed pulse, and means for applying said voltage to said second storage means whenever either discharge device is rendered conductive.

6. In a communication system including means for transmitting and receiving pulses representing intelligence to be communicated, said receiving means including a pair of electron discharge devices each having an anode, a cathode and a control electrode, said anodes and cathodes being inversely connected, means for impressing the received pulses on said control electrodes, electric storage means connected between each anode-cathode connection and ground, means for reproducing each received pulse after a predetermined time delay, means for charging a first of said storage means in accordance with the voltage of said delayed pulse and means for applying said voltage to the second of said storage means whenever either discharge device is rendered conductive, said second storage means having a capacitance substantially less than the capacitance of said first storage means so that the voltage on said first storage means is substantially unaffected by the transfer of voltage to said second storage means.

7. In a communication system including means for transmitting and receiving pulses representing intelligence to be communicated, said receiving means including a pair of electron discharge devices, each of said devices having an anode, a cathode, and a control electrode, said anodes and cathodes being inversely connected, means for impressing voltages representing the received pulses on said control electrodes, a capacitor connected between each anode-cathode connection and ground, a source of recurring voltage, means for controlling the time of recurrence of said recurring voltage in accordance with a characteristic of the received pulses, and means for applying said recurring voltage to one capacitor whereby the potential of said capacitor is applied to the other capacitor whenever either discharge device is conducting whereby the changes in voltage across said other capacitor follow the voltage representing the intelligence transmitted.

8. In a communication system including means for transmitting and receiving pulses representing intelligence to be communicated, said receiving means including a pair of electron discharge devices, each of said devices having an anode, a cathode, and a control electrode, said anodes and cathodes being inversely connected, means for impressing voltages representing the received intelligence on said control electrodes, a capacitor connected between each anode-cathode connection and ground, a source of recurring voltage, means for controlling the times of recurrence of said recurring voltage in accordance with the times of repetition of the intelligence voltage, and means for applying said recurring voltage to one capacitor whereby the potential of said one capacitor is applied to the other capacitor whenever either discharge device is conducting so that the changes in voltage across said other capacitor follow the voltage representing the intelligence transmitted.

9. In a communication system including transmitting means and receiving means, said receiving means having means for detecting intelligence to be reproduced comprising a pair of electron discharge devices, each of said devices having an anode, a cathode, and a control electrode, said anodes and cathodes being inversely connected, means for impressing voltages representing the received intelligence on said control electrodes, a capacitor connected between each anode-cathode connection and ground, a wave generator including an electron discharge device and a resistance-capacitance network, said generator being normally inoperative, means for impressing a delayed counterpart of said signal on the control electrode of said electron discharge device for rendering operative said generator to produce a voltage across said network, and means for impressing said voltage on one of said anode-cathode connections, a capacitor connected between the other anode-cathode connection and ground whereby the voltage generated by said generator is applied to said capacitor whenever said generator is operative.

10. In a communication system including means for transmitting and receiving pulses representing intelligence to be communicated, said receiving means including a pair of electron discharge devices, each of said devices having an anode, a cathode and a control electrode, said anodes and cathodes being inversely connected, means for impressing said pulses on said control electrodes, means for obtaining a delayed counterpart of said pulses, the delay interval being less than the interval between successive pulses, a first capacitor connected to be charged by said counterpart, means permitting at least partial dissipation of said charge between charging intervals, means for impressing the potential of said first capacitor on one of said anode-cathode connections, and a second capacitor connected to the other of said anode-cathode connections whereby said second capacitor samples the charge on said first capacitor during conduction of either of said discharge devices, the voltage across said second capacitor reproducing closely the voltage corresponding to the intelligence transmitted.

11. In a modulated wave communication system having means for transmitting and receiving modulated signals, said receiving means including means for reproducing the intelligence received from said transmitting means, said means including a pair of electron discharge devices, each device having an anode, a cathode and a control electrode, said anodes and cathodes being inversely connected, a capacitor connected between each anode-cathode connection and ground, means for impressing a voltage corresponding to the modulated signals on one of said anode-cathode connections, and means utilizing the received signal and said control electrodes for rendering conductive one or the other of said discharge devices at substantially the peaks of each cycle of the received-signal carrier whereby the voltage of the capacitor connected to said one anode-cathode connection is applied to the other capacitor each time either discharge device is rendered conductive.

12. In a modulated wave communication system including transmitting and receiving means, said receiving means including means for detecting and reproducing the received intelligence comprising a pair of electron discharge devices, each of said discharge devices having an anode, a cathode, and a control electrode, said anodes and cathodes being inversely connected, a third electron discharge device having an anode, a cathode, and control electrode, resistance means connected between the last mentioned cathode and ground, capacitance means connected in parallel with said resistance means, means for impressing the received signal on the control electrode of said third discharge device, means for impressing the voltage appearing across said capacitance means on one of the anode-cathode connections, capacitance means connected between the other anode-cathode connection and ground, and means for rendering one or the other of said discharge devices operative at predetermined times whereby the potential of said first capacitance means is transferred to said second capacitance means.

13. The method of reception of pulse modulated signals which comprises receiving said pulses, developing a voltage of a given value for each pulse, developing a second voltage corresponding to the first mentioned voltage but delayed in time, dissipating said second voltage in accordance with a function of time for an interval terminated by the succeeding pulse in the train whereby the minima of the said second voltages at the termination of the several intervals define an envelope corresponding to the original signal, utilizing said first voltage to sample said second voltage at approximately the times of occurrence of said minima, and translating the sampled voltages into sound.

*14. In combination, a source of energy pulses modulated in repetition period; a saw tooth wave generating and shaping means responsive thereto; an energy storage circuit; and means momentarily applying the output of said generating and shaping means to said energy storage circuit near the peak of each of the saw tooth excursions of said output.*

JAMES A. KRUMHANSL.
HAROLD GOLDBERG.

REFERENCES CITED

The following references are of record in the file of this patent:

UNITED STATES PATENTS

| Number | Name | Date |
|---|---|---|
| 2,113,011 | White | Apr. 2, 1938 |
| 2,335,265 | Dodington | Nov. 30, 1943 |
| 2,404,306 | Luck | July 16, 1946 |
| 2,406,019 | Labin | Aug. 19, 1946 |
| 2,406,978 | Wendt | Sept. 3, 1946 |
| 2,411,573 | Holst | Nov. 26, 1946 |
| 2,412,994 | Lehmann | Dec. 24, 1946 |
| 2,415,567 | Schoenfeld | Feb. 11, 1947 |
| 2,415,918 | Thomas | Feb. 18, 1947 |
| 2,416,308 | Grieg | Feb. 25, 1947 |
| 2,436,890 | Higinbotham | Mar. 2, 1948 |
| 2,500,536 | Goldberg | Mar. 14, 1950 |